US009093991B2

United States Patent
Choi et al.

(10) Patent No.: US 9,093,991 B2
(45) Date of Patent: Jul. 28, 2015

(54) LINE DRIVING CIRCUIT IMPROVING SIGNAL CHARACTERISTIC AND SEMICONDUCTOR DEVICE INCLUDING THE SAME

(71) Applicant: SAMSUNG ELECTRONICS CO., LTD., Suwon-si (KR)

(72) Inventors: Won-ho Choi, Suwon-si (KR); Jae-jung Park, Bucheon-si (KR); Chang-eun Kang, Seoul (KR); Hyeok-jong Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/463,890

(22) Filed: Aug. 20, 2014

(65) Prior Publication Data

US 2015/0054551 A1 Feb. 26, 2015

(30) Foreign Application Priority Data

Aug. 21, 2013 (KR) ........................ 10-2013-0099235

(51) Int. Cl.
*H03K 3/00* (2006.01)
*H03K 3/013* (2006.01)

(52) U.S. Cl.
CPC ...................................... *H03K 3/013* (2013.01)

(58) Field of Classification Search
USPC ........ 327/108, 109, 111, 112; 326/82, 83, 86, 326/87; 365/230.06
See application file for complete search history.

(56) References Cited

U.S. PATENT DOCUMENTS

| 5,811,984 | A  * | 9/1998 | Long et al. ...................... 326/30 |
| 5,945,850 | A    | 8/1999 | Segan et al. |
| 7,394,292 | B2 * | 7/2008 | Hosokawa et al. ............. 326/83 |
| 7,821,300 | B2   | 10/2010 | Bernard et al. |
| 7,830,176 | B2 * | 11/2010 | Hold et al. ...................... 326/86 |
| 8,310,574 | B2   | 11/2012 | Okano et al. |
| 8,344,771 | B2   | 1/2013  | Shin |
| 8,896,341 | B2 * | 11/2014 | Sofer et al. ...................... 326/30 |
| 2005/0259168 | A1 | 11/2005 | Kameshima et al. |
| 2006/0232308 | A9 | 10/2006 | Kumata |
| 2009/0309642 | A1 | 12/2009 | Kim |
| 2010/0316185 | A1 | 12/2010 | Fujita et al. |

FOREIGN PATENT DOCUMENTS

KR 10-0869855 B1 11/2008

* cited by examiner

*Primary Examiner* — William Hernandez
(74) *Attorney, Agent, or Firm* — Sughrue Mion, PLLC

(57) ABSTRACT

A line driving circuit in which a signal characteristic is improved and a semiconductor device including the same are provided. The semiconductor device includes: a line controller arranged in a first portion of at least one line; a first driver arranged in the first portion and configured to output through the at least one line a first signal according to a control of the line controller; and a second driver arranged in a second portion of the at least one line and configured to output through the at least one line a second signal according to a level of the first signal.

19 Claims, 16 Drawing Sheets

LINE DRIVING CIRCUIT IMPROVING SIGNAL CHARACTERISTIC AND SEMICONDUCTOR DEVICE INCLUDING THE SAME

CROSS-REFERENCE TO RELATED APPLICATION

This application claims priority from Korean Patent Application No. 10-2013-0099235, filed on Aug. 21, 2013, in the Korean Intellectual Property Office, the disclosure of which is incorporated herein in its entirety by reference.

BACKGROUND

Apparatuses, devices, and articles of manufacture consistent with the present disclosure relate to a line driving circuit and a semiconductor device including the same, and more particularly, to a line driving circuit in which a signal characteristic is improved and a semiconductor device including same.

As semiconductors become smaller and smaller, signal lines become closer and closer together. This results in a disadvantage in that the signal characteristic of the signal transmitted over the signal lines deteriorates due to a parasitic capacitance element or a parasitic resistance element formed on the lines. That is, as a slope of the signal becomes lower, a rise time or a fall time may increase.

Particularly, when the signal is transmitted through a physically long line, the signal characteristic may deteriorate. It is possible to design a buffer in order to improve the deterioration somewhat. However, there is a disadvantage in that the ability to design a buffer with a strong driving force for outputting the signal is limited. Moreover, in a case in which multiple buffers are arranged to produce a stronger driving force, there is a disadvantage in that the area used by the buffers increases, and another disadvantage in that skew may occur.

SUMMARY

Exemplary embodiments provide a line driving circuit which may reduce a deterioration of a characteristic of a signal transmitted through a line in a semiconductor device, and a semiconductor device including the same.

According to an aspect of an exemplary embodiment, there is provided a semiconductor device including: a line controller arranged in a first portion of at least one line; a first driver arranged in the first portion and configured to output a first signal through the at least one line according to a control of the line controller; and a second driver arranged in a second portion of the at least one line and configured to output a second signal through the at least one line according to a level of the first signal.

The semiconductor device may further include an array that includes as the line a word line electrically connected to at least one cell.

The first driver may include a first buffer connected to a first line of the at least one line, and the second driver may include a second buffer connected to the first line, wherein the second buffer is configured to receive the first signal through the first line and output the second signal through the first line according to a comparison of the first signal and at least one reference voltage.

The second buffer may include a driving circuit configured to output a driving signal in response to the first signal, a first reference voltage, and a second reference voltage, and compare the first signal with the first reference voltage or compare the first signal with the second reference voltage; and a buffer circuit configured to output the second signal through the first line in response to the driving signal.

The driving circuit may be configured to output a first driving signal that is activated during a first section of the first signal in which the first signal is greater than or equal to the first reference voltage, and a second driving signal that is activated during a second section of the first signal in which the first signal is less than or equal to the second reference voltage.

The buffer circuit may be configured to output through the first line the second signal that is at a logic high level when the first driving signal is activated, and that is at a logic low level when the second driving signal is activated.

The first section may include at least a portion of a rise section of the first signal, and the second section may include at least a portion of a fall section of the first signal.

The driving circuit may include a first comparator configured to output a first comparison signal by comparing the first signal and the first reference voltage; a second comparator configured to output a second comparison signal by comparing the first signal and the second reference voltage; and a driving signal generator configured to output the driving signal according to the first comparison signal or the second comparison signal, wherein at least one of the first comparison signal and the second comparison signal is delayed and the delayed at least one of the first comparison signal and the second comparison signal is output to the driving signal generator.

The second driver may include at least one buffer that is connected to the at least one line and receives at least one reference voltage, and wherein each of the at least one buffer has a feedback structure in which an input and an output of the buffer are connected to each other, and each of the at least one buffer outputs the second signal that is at a logic high level or a logic low level according to a comparison result of levels of the first signal and the reference voltage.

According to an aspect of another exemplary embodiment, there is provided a line driving circuit including: a first buffer arranged in a first portion of a line electrically connected to at least one internal circuit and configured to output a first signal through the line; and a second buffer arranged in a second portion of the line, and configured to receive the first signal and at least one reference voltage, and output a second signal through the line according to a comparison of levels of the first signal and the at least one reference voltage.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
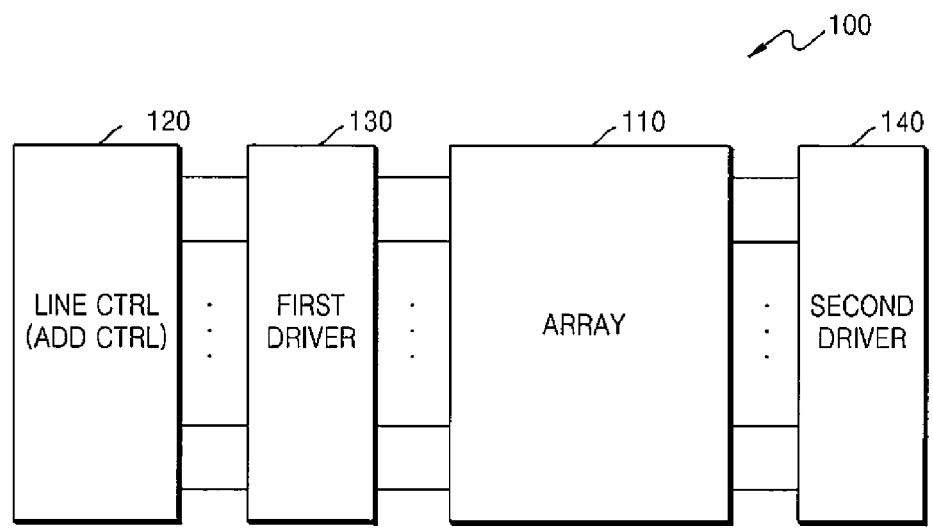
FIG. 1 is a block diagram of a semiconductor device according to an exemplary embodiment.

The above and other aspects of the inventive concept will be described more fully with reference to the accompanying drawings, in which exemplary embodiments are shown.

Hereinafter, one or more exemplary embodiments will be described more fully with reference to the accompanying drawings. In the drawings, like reference numerals refer to like elements. Expressions such as "at least one of," when preceding a list of elements, modify the entire list of elements and do not modify the individual elements of the list.

FIG. 1 is a block diagram of a semiconductor device 100 according to an exemplary embodiment. As shown in FIG. 1, the semiconductor device 100 may include a first driver 130 and a second driver 140. Also, the semiconductor device 100 may include an array 110 including a plurality of transmittance lines (hereinafter, referred to as lines). For example, the array 110 may include as the lines a plurality of word lines and a plurality of bit lines. The array 110 may include cells arranged in a section in which the word lines and the bit lines are crossed. For example, when the semiconductor device 100 is a memory device, the array 110 may include memory cells.

As an example of the memory device, when the semiconductor device 100 is a dynamic random access memory (DRAM), the array 110 may include DRAM cells. When the semiconductor device 100 is a magnetic random access memory (MRAM), the array 110 may include MRAM cells. In addition, various other memory devices may be applied. For example, the array 110 may include flash memory cells, phase change random access memory (PRAM) cells, ferro-electrics random access memory (FRAM) cells, and the like.

In addition, the array 110 may include other circuits having an array structure including a plurality of word lines and a plurality of bit lines. For example, when the semiconductor device 100 is a complementary metal oxide semiconductor (CMOS) image sensor, the array 110 may include pixels including a photo diode. Alternatively, when the semiconductor device 100 includes fuses (or anti-fuses) having an array structure, the array 110 may be a fuse array (or, an anti-fuse array).

The semiconductor device 100 may further include a line controller (LINE CTRL) 120. The line controller 120 may receive an address signal from outside and output a control signal according to the received address signal, in order to perform a selected operation for lines of the array 110. For example, the line controller 120 may receive a row address or a column address, and, in response, may perform a selected operation with respect to the plurality of word lines and/or the plurality of bit lines included in the array 110. Since the selected operation relates to the lines through which driving may be performed, under a control of the line controller 120, the line controller 120 may be referred to as an address controller (ADD CTRL).

According to the current exemplary embodiment, the first driver 130 may be arranged in a first portion of the line and the second driver 140 may be arranged in a second portion of the line. For example, when the first driver 130 and the second driver 140 drive the word lines of the array 110 and the word lines are arranged in a horizontal direction in the array 110, the first driver 130 may be arranged in a portion (for example, a left portion) of the array 110, and the second driver 140 may be arranged in the other portion (for example, a right portion) of the array 110. In this configuration, the line controller 120 may be arranged close to the first driver 130 or to the second driver 140. For example, FIG. 1 illustrates a case in which the line controller 120 is arranged close to the first driver 130.

Although FIG. 1 illustrates the lines included in the array 110 as lines for transmitting signals, exemplary embodiments of the inventive concept are not limited thereto. The semiconductor device 100 may include various lines for transmitting various signals (for example, data signals, voltage signals, and control signals). The exemplary embodiment of the inventive concept may include those various lines.

An operation method of the semiconductor device 100 illustrated in FIG. 1, according to an exemplary embodiment, will now be described. As described above, the example in which the word lines of the array 110 are driven is described, and the word lines may also be referred to as the lines.

The first driver 130 includes a plurality of buffers (for example, first buffers), and each of the first buffers may be connected to one of the lines. That is, the first buffers may have a one-to-one relationship with the lines. According to a control of the line controller 120, at least one first buffer of the first buffers outputs a first signal through the line. The first signal is provided to at least one cell connected to the array 110 through the line, and to the second driver 140.

The second driver 140 may also include a plurality of buffers (for example, second buffers), and each of the second buffers may be connected to one of the lines. That is, the second buffers may have a one-to-one relationship with the lines. Accordingly, the first buffer is arranged in a first portion of one of the lines, and one of the second buffers may be arranged in a second portion of the one of the lines.

The first and second buffers are thus arranged respectively in two portions of the line (for example, referred to as a first line), and a signal (hereinafter, referred to as a first signal)

transmitted through the first line from the first buffer is provided as an input to the second buffer. The second buffer senses a level of the first signal and, according to the result of sensing the level of the first signal, outputs a second signal through the first line. Accordingly, although a characteristic (for example, a slope characteristic) of the first signal transmitted through the first line may be deteriorated and the first signal having the deteriorated characteristic is provided to some cells located relatively far from the first buffer, the cells that are located relatively far from the first buffer may be provided with the second signal from the second buffer located in a direction opposite to the first buffer. Thus, in overall, the signal having a good characteristic (for example, a signal having an improved slope characteristic) may be provided to the cells connected to the first line.

Figure 2:
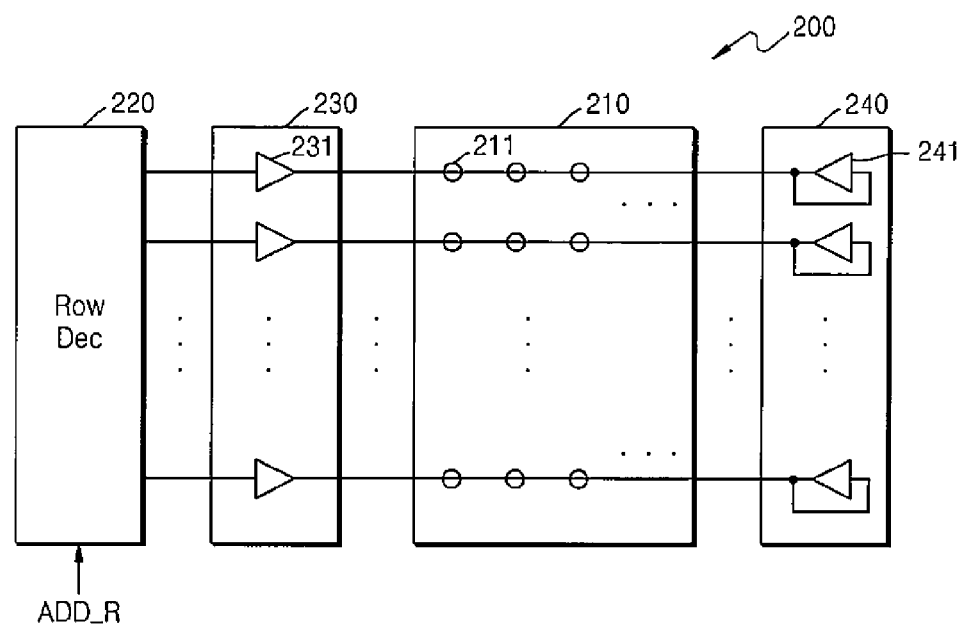
FIG. 2 is a block diagram showing a semiconductor device according to another exemplary embodiment.

FIG. 2 is a block diagram of a semiconductor device according to another exemplary embodiment. As shown in FIG. 2, a semiconductor device 200 may include as a driver a first buffer 230 including a plurality of first buffers 231 and a second buffer 240 including a plurality of second buffers 241. Also, the semiconductor device 200 may include an array 210 including a plurality of lines. The array 210 may include a plurality of cells 211 on each line. For example, when the array 210 includes a plurality of word lines as the lines, a plurality of cells may be connected to each of the word lines. Also, a row decoder (row dec) 220 that performs a selected operation with respect to the word lines by decoding a row address ADD_R may be included in the semiconductor device 200, as an line controller.

The row decoder 220 and the first buffer 230 are arranged in a first portion of the array 210. The second buffer 240 is arranged in a second portion of the array 210. An operation of the current exemplary embodiment will be described below by referring to one of the first buffers 231 that is included in the first buffer 230 and one of the second buffers 241 that is included in the second buffer 240.

The first buffer 231 outputs a first signal through the line (for example, a first word line). Some (for example, the cells that are physically located far from the first buffer 231) of the plurality of cells connected to the first word line may be provided with the first signal having a deteriorated slope characteristic (e.g., having a low slope) due to a parasitic RC element of the line. The second buffer 241 has a feedback structure in which an input and an output are electrically connected to each other. The second buffer 241 receives the first signal through the first word line as an input signal. Thus, the first signal provided to the second buffer 241 may also have the low slope since the second buffer 241 is provided in the second portion of the array 210. The second buffer 241 senses a level of the first signal and, according to the result of sensing the level of the first signal, generates a second signal and outputs the second signal through the first word line.

As an example of a more detailed operation, the second buffer 241 may receive at least one reference voltage. In terms of the second buffer 241 outputting the second signal, the second buffer 241 may compare levels of the received first signal and the reference voltage, and output the second signal according to the result of the comparison. For example, the second buffer 241 may output the second signal of logic high by sensing a specific level of a voltage in a rise section of the received first signal. Also, the second buffer 241 may output the second signal of logic low by sensing a specific level of a voltage in a fall section of the received first signal. The second signal as described above is a signal in which the slope characteristic is improved compared to the received first signal that is provided as an input of the second buffer 241. Accordingly, the second signal having the improved slope characteristic may be provided to the cells connected to the first word line. The operation has been described with respect to the first word line, the first buffer 231 and the second buffer 241. Since the operation of the other first buffers 231 and second buffers 241 on the other word lines are the same, detailed description is omitted here for purposes of clarity of description.

Figure 3:
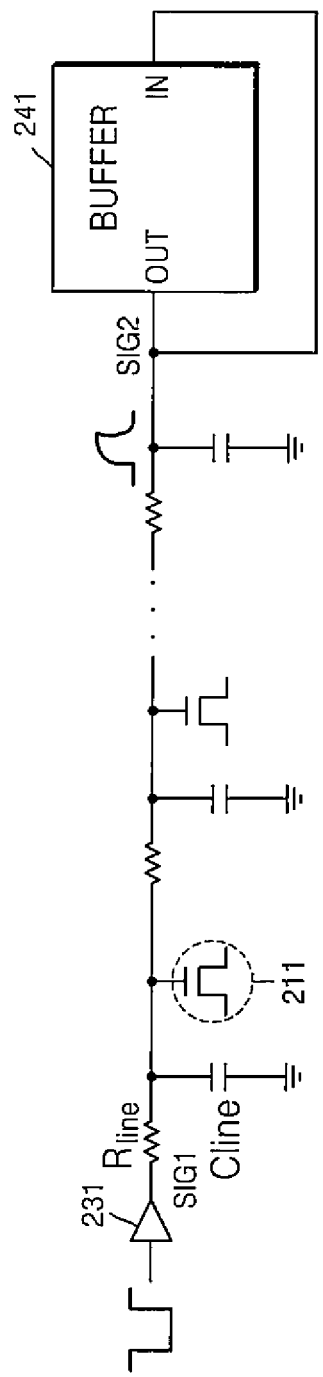
FIG. 3 is a block diagram showing more detail of the semiconductor device of FIG. 2, according to an exemplary embodiment.

FIG. 3 is a block diagram showing more detail of the semiconductor device of FIG. 2, according to an exemplary embodiment. As shown in FIG. 3, the line (for example, the first word line) has a parasitic capacitance element (Cline) and a parasitic resistive element (Rline). The first buffer 231 and the second buffer 241 are arranged in two portions of the first word line. At least one cell may be connected to the first word line. For example, as shown in FIG. 3, a transistor 211 included in the plurality of cells may be connected to the first word line. Moreover, the second buffer 241 may have a feedback structure in which an input IN and an output OUT may be electrically connected.

As a first signal SIG1 that is output from the first buffer 231 is transmitted through the first word line in which the parasitic RC element exists, cells that are physically located far from the first buffer 231 may be provided with the first signal SIG1 having a deteriorated slope characteristic. The second buffer 241 receives the first signal SIG1 from the first buffer 231 by the input IN, senses a level of the first signal SIG1, and, according to the sensing result, outputs a second signal SIG2 in which the slope characteristic is improved through the first word line by the output OUT. Accordingly, as the second signal SIG2 having the improved slope characteristic is provided to the cells physically located far from the first buffer 231, the characteristic of the signal that is provided to the plurality of cells connected to the first word line may be improved.

According to the current exemplary embodiment, since there is no need to provide an additional input signal to the buffers (for example, the second buffers) arranged in the other portion of the line, and also there is no need of an additional circuit for driving the buffers arranged in the other portion of the line, an increase of an area of the semiconductor device may be prevented. In addition, since an increase of an input skew between the first buffer and the second buffer may be prevented, the signal characteristic may also be improved.

Figure 4:
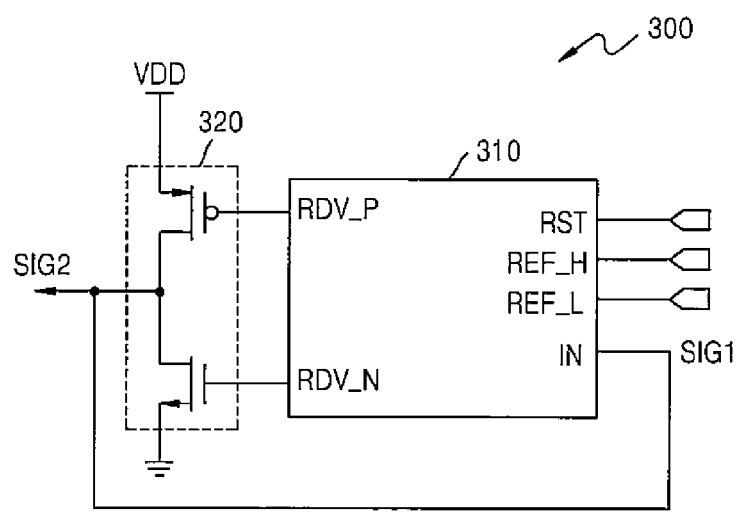
FIG. 4 is a circuit diagram of a buffer included in a driver of the semiconductor device of FIG. 1, according to an exemplary embodiment.

FIG. 4 is a circuit diagram of a buffer included in the driver of the semiconductor device of FIG. 1, according to an exemplary embodiment. In detail, the buffer of FIG. 4 is an exemplary embodiment of a second buffer (referred to as the second buffer) included in the second driver 140.

As shown in FIG. 4, the second buffer 300 may include a driving circuit 310 and a buffer circuit 320. The driving circuit 310 may receive a first signal SIG1 from a first driver through a line. The driving circuit 310 may receive at least one reference voltage. For example, as shown in FIG. 4, the driving circuit 310 may receive a first reference voltage REF_L and a second reference voltage REF_H. Also, in another exemplary embodiment, the driving circuit 310 may further receive a reset signal RST.

The buffer circuit 320 may include circuits for outputting a second signal SIG2 through the line. FIG. 4 illustrates an example in which the buffer circuit 320 includes an inverter. The buffer circuit 320 may be connected between a power voltage VDD and a ground voltage. The buffer circuit 320 may output the second signal SIG2 of logic high or output the second signal SIG2 of logic low through the line by responding to driving signals RDV_P and RDV_N from the driving circuit 310.

The driving circuit 310 may output the driving signal according to the result of comparing the first signal SIG1 and the first reference voltage REF_L, and comparing the first signal SIG1 and the second reference voltage REF_H. For example, a point in which the first signal is greater than or equal to the first reference voltage REF_L in a rise section of the first signal may be sensed and, according to the sensing result, a first driving signal RDV_P may be activated and output. For example, when the first driving signal RDV_P of logic low is provided to the buffer circuit 320, the second signal SIG2 of logic high by a pull-up operation of the buffer circuit 320 may be output through the line.

Also, a point in which the first signal SIG1 is less than or equal to the second reference voltage REF_H in a fall section of the first signal SIG1 may be sensed and, according to the sensing result, a second driving signal RDV_N may be activated and output. For example, when the second driving signal RDV_N of logic high is provided to the buffer circuit 320, the second signal SIG2 of logic low by a pull-down operation of the buffer circuit 320 may be output through the line.

Figure 5:
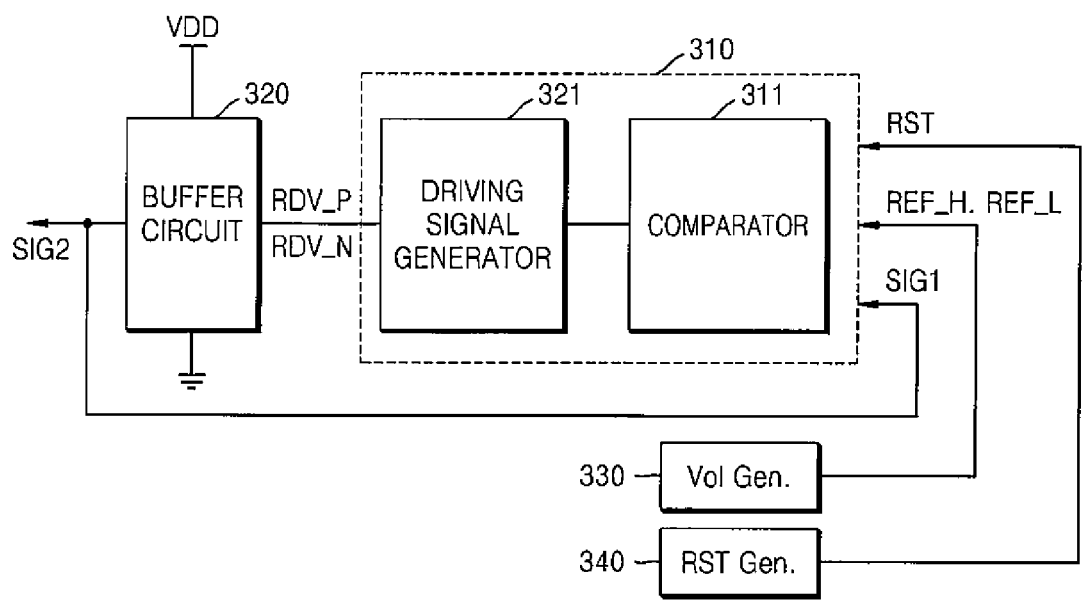
FIG. 5 is a more detailed block diagram of the buffer of FIG. 4, according to an exemplary embodiment.

FIG. 5 is a block diagram of the buffer of FIG. 4, according to an exemplary embodiment. As shown in FIG. 5, the driving circuit 310 may include a comparator 311 and a driving signal generator 312. The buffer circuit 320 may generate the second signal SIG2 by being connected between the power voltage VDD and the ground voltage. Also, the driving circuit 310 may receive the first signal SIG1, and the first reference voltage REF_L and the second reference voltage REF_H. The driving circuit 310 may further include the reset signal RST. As shown in FIG. 5, a voltage generator (Vol Gen.) 330 for generating the reference voltages REF_L and REF_H and a reset signal generator (RST Gen.) 340 for generating the reset signal RST may further be included in the semiconductor device.

The comparator 311 may output a comparison result of the first signal SIG1 and the first reference voltage REF_L and a comparison result of the first signal SIG1 and the second reference voltage REF_H. The driving signal generator 312 may output the first driving signal RDV_P and the second driving signal RDV_N based on the comparison results. The buffer circuit 320 may output the second signal SIG2 of logic high or logic low through the line by responding to the first driving signal RDV_P and the second driving signal RDV_N.

Figure 6:
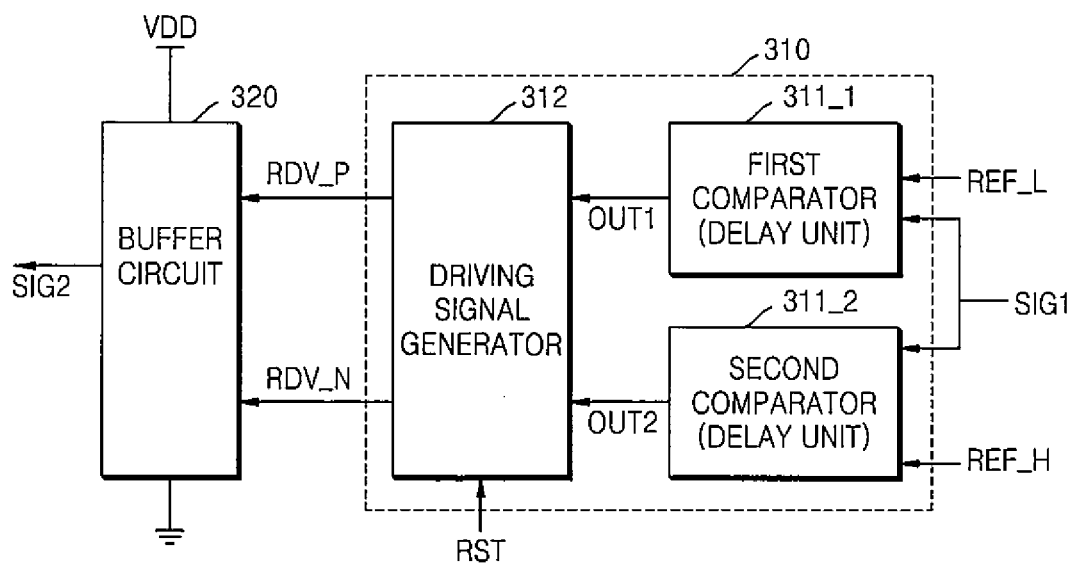
FIG. 6 is a more detailed block diagram of the buffer of FIG. 4, according to another exemplary embodiment.

FIG. 6 is a block diagram of the buffer of FIG. 4, according to another exemplary embodiment. As shown in FIG. 6, the driving circuit 310 may include a first comparator 311_1, a second comparator 311_2, and the driving signal generator 312. The buffer circuit 320 may generate the second signal SIG2 by being connected between the power voltage VDD and the ground voltage. The first comparator 311_1 may output a first comparison result signal OUT1 by receiving the first signal SIG1 and the first reference voltage REF_L. The second comparator 311_2 may output a second comparison result signal OUT2 by receiving the first signal SIG1 and the second reference voltage REF_H. The driving signal generator 312 may output the first driving signal RDV_P and the second driving signal RDV_N by responding to the first comparison result signal OUT1 and the second comparison result signal OUT2. As the reset signal RST is provided to the driving signal generator 312, the reset function with respect to an output operation of the second signal may be provided.

The first comparator 311_1 and the second comparator 311_2 may respectively apply a delay in terms of outputting the comparison result signals. For example, the first comparator 311_1 and the second comparator 311_2 may respectively include a delay unit. Alternatively, the first comparator 311_1 and the second comparator 311_2 may, without an additional delay unit, make the comparison result signals be delayed for a certain period of time before being activated by a design alteration. For example, the first comparator 311_1 and the second comparator 311_2 may respectively output the first comparison result signal OUT1 and the second comparison result signal OUT2 by pull-up and pull-down operations, respectively. Also, the first comparison result signal OUT1 and the second comparison result signal OUT2 may be delayed before being output with a delay with respect to the pull-up and pull-down operations, respectively.

The driving signal generator 312 may output the first driving signal RDV_P and the second driving signal RDV_N by using the first comparison result signal OUT1 and the second comparison result signal OUT2, respectively. For example, the driving signal generator 312 may include at least one logic circuit for receiving and logic operating the first driving signal RDV_P and the second driving signal RDV_N and the reset signal RST. Also, the driving signal generator 312 may output the first driving signal RDV_P for pulling up the second signal SIG2 or the second driving signal RDV_N for pulling down the second signal SIG2. The driving signal generator 312 may respectively output the first driving signal RDV_P and the second driving signal RDV_N that are activated during a certain section, by a logic operation with respect to the output (or the delayed output) of the first comparator 311_1 and the second comparator 311_2. For example, the first driving signal RDV_P may be activated during a first section, and the first section may be a section that includes at least a portion of a rise section of the first signal SIG1. The second driving signal RDV_N may be activated during a second section, and the second section may be a section that includes at least a portion of a fall section of the first signal SIG1.

Figure 7:
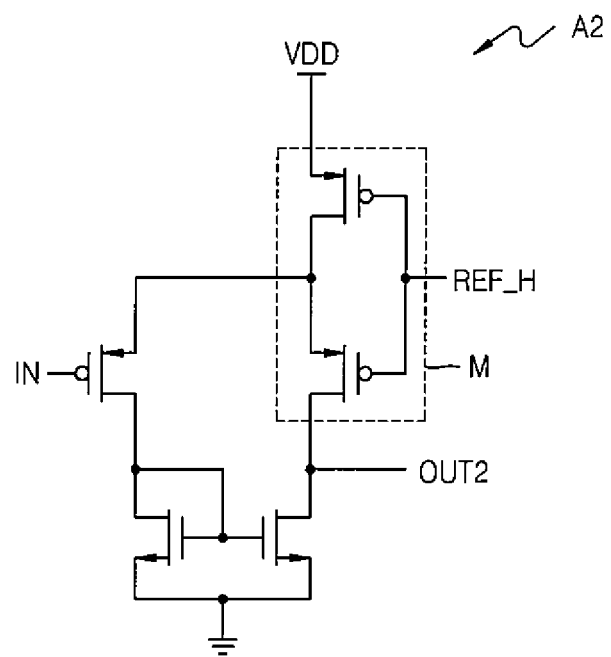
FIGS. 7 and 8 are circuit diagrams of a comparator included in the buffer of FIG. 4, according to an exemplary embodiment.
Figure 8:
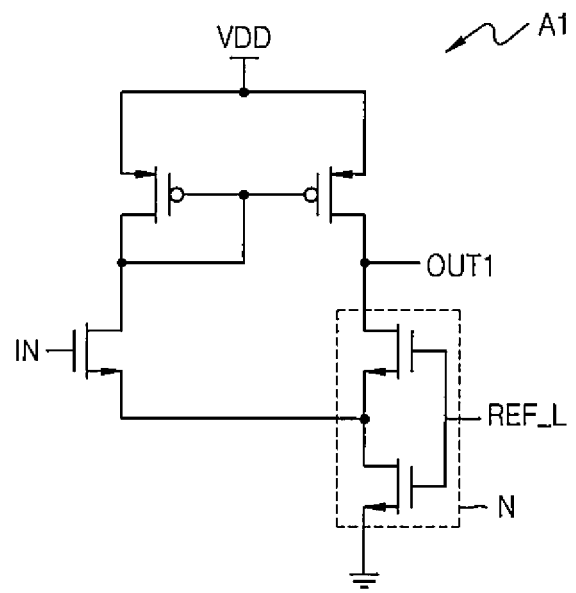
Figure 9:
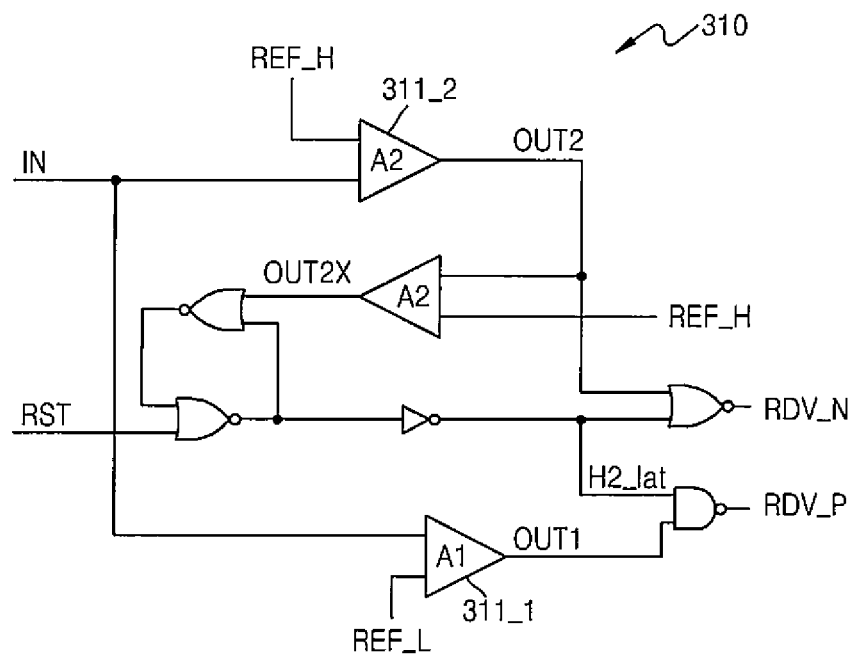
FIG. 9 is a circuit diagram of a driving circuit including at least one comparator and at least one driving signal generator, according to an exemplary embodiment.
Figure 10:
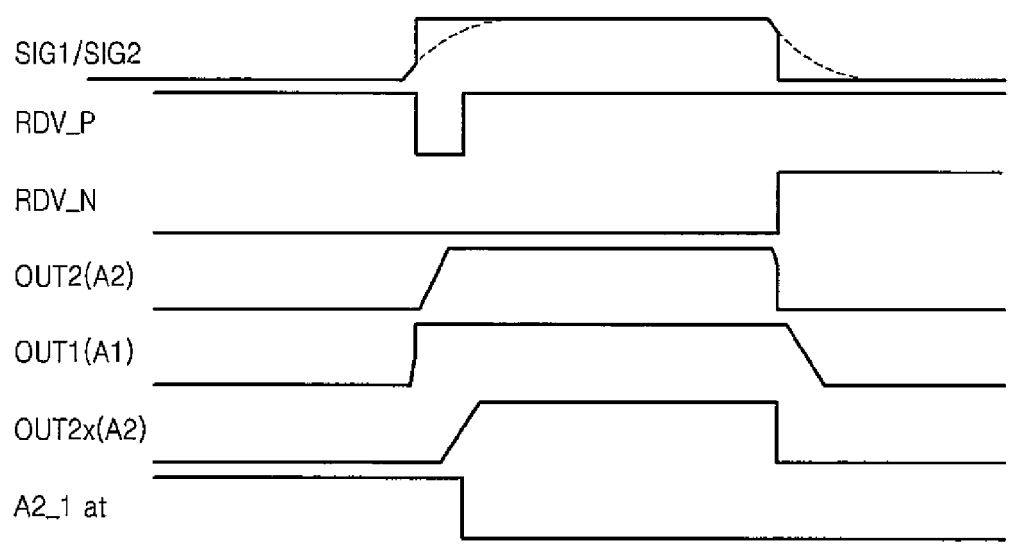
FIG. 10 is an example of a spectrogram of various signals according to an exemplary embodiment.
Figure 11:
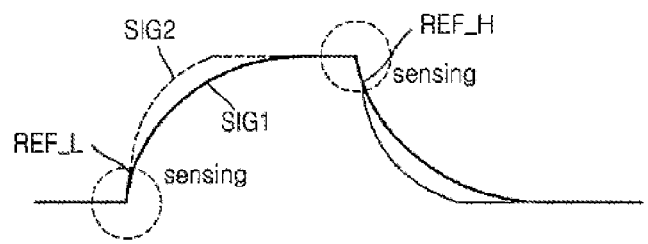
FIG. 11 is an example of a spectrogram illustrating an example of slope characteristics of first and second signals transmitted through a line, according to an exemplary embodiment.

An example of a more detailed operation of the buffer illustrated in FIG. 4 will be described by referring to FIGS. 7 through 11. FIGS. 7 and 8 are circuit diagrams of the comparator included in the buffer (hereinafter, the second buffer) of FIG. 4, according to an exemplary embodiment. FIG. 9 is a circuit diagram of the driving circuit including at least one comparator and at least one driving signal generator, according to an exemplary embodiment. FIG. 10 is an example of a spectrogram of various signals according to an exemplary embodiment. FIG. 11 is an example of a spectrogram illustrating slope characteristics of the first signal and the second signal transmitted through the line.

As shown in FIG. 9, the driving circuit 310 may include logic circuits and at least one comparator. For example, the driving circuit 310 may include the first comparator 311_1 A1 and the second comparator 311_2 A2 illustrated in FIG. 6. Also, as shown in FIG. 9, the driving circuit 310 may further include at least one additional comparator. For example, circuits (hereinafter, referred to as an additional second comparator) having the same structure as the second comparator A2 are additionally included in the driving circuit 310 are illustrated. An example in which the additional second comparator 311_3 A2 receives an internal signal (for example, the comparison result signal, OUT2) instead of the first signal SIG1 is illustrated in FIG. 9. Also, as shown in FIG. 8, the first comparator A1 may output the first comparison result signal OUT1 according to levels of the first signal SIG1 and the first reference voltage REF_L. Also, as shown in FIG. 7, the second comparator A2 may output the second comparison result signal OUT2 according to levels of the first signal SIG1 and the second reference voltage REF_H.

As shown in FIG. 8, in the first comparator A1, the first reference voltage REF_L may be provided by an input of transistors N that are connected in series. When the first signal SIG1 is greater than or equal to the first reference voltage REF_L, the first comparison result signal OUT1 may change to logic high. Also, when the first signal SIG1 is lower than the first reference voltage REF_L, the first comparison result signal OUT1 may change to logic low. Also, when a driving force of the transistors N that are connected in series is low, the first comparison result signal OUT1 may be generated by being delayed for a certain period of time when the first comparison result signal OUT1 changes from logic high to logic low.

In a similar manner, as shown in FIG. 7, in the second comparator A2, the second reference voltage REF_H may be provided by an input of the transistors M that are connected in series. When the first signal SIG1 is greater than or equal to the second reference voltage REF_H, the second comparison result signal OUT2 may change to logic high. Also, when the driving force of the transistors M that are connected in series is low, the second comparison result signal OUT2 may be generated by being delayed for a certain period of time when the second comparison result signal OUT2 changes from logic low to logic high. Meanwhile, when the first signal SIG1 is less than the second reference voltage REF_H, the second comparison result signal OUT2 may change to logic low.

An operation of the driving circuit 310 illustrated in FIG. 9 will be described by referring to the spectrograms of FIGS. 10 and 11. As shown in FIG. 11, a voltage of a certain level during the rise section of the first signal SIG1 may be sensed according to the first reference voltage REF_L and, a voltage of a certain level during the fall section of the first signal SIG1 may be sensed according to the second reference voltage REF_H. In addition, the second reference voltage REF_H may have a higher level than the first reference voltage REF_L.

When the first signal SIG1 rises with a low slope and is input into the second buffer, the first comparator A1 compares the first signal SIG1 and the first reference voltage REF_L and outputs the first comparison result signal OUT1 of logic high as the first signal SIG1 increases. According to the first comparison result signal OUT1, the first driving signal RDV_P is activated and output. Accordingly, the second signal SIG2 of logic high is output from the buffer circuit 320 of FIG. 4.

Meanwhile, when the first signal SIG1 gradually rises, the first signal SIG1 may have a level that is the same as or greater than that of the second reference voltage REF_H and the second comparator A2 may output the second comparison result signal OUT2 of logic high according to the comparison of the first signal SIG1 and the second reference voltage REF_H. Here, as described above, by the transistors M that are connected in series and receiving the second reference voltage REF_H, the second comparison result signal OUT2 may have a wave form in which a delay for a certain period of time exists. Also, as shown in FIG. 9, the driving circuit 310 may further include the additional second comparator 311_3 A2. The additional second comparator 311_3 A2 may receive the second comparison result signal OUT2 and the second reference voltage REF_H, and may output a signal (for example, a delayed second comparison result signal OUT2x) that is a delayed signal of the second comparison result signal OUT2. By a logic operation process with respect to the delayed second comparison result signal OUT2x, a control signal H2_lat may be generated and, according to the control signal H2_lat, the first driving signal RDV_P may be deactivated.

According to the described operation, the second buffer receives the first signal SIG1 having a relatively low slope as an input, and may output the second signal SIG2 that is pulled up during a section in which the first driving signal RDV_P is activated. For example, the second signal SIG2 may be output by making the buffer circuit 320 perform a pull-up operation during a section including at least a portion of the rise section of the first signal SIG1.

Meanwhile, in the fall section of the first signal SIG1, the second comparator A2 compares the first signal SIG1 and the second reference voltage REF_H, and may output the second comparison result signal OUT2 of logic low when the level of the first signal SIG1 is lower. The second driving signal RDV_N may be generated by a logic operation process with respect to the second comparison result signal OUT2. For example, the second driving signal RDV_N may be generated by an NOR operation with respect to the control signal H2_lat and the second comparison result signal OUT2. The buffer circuit 320 performs a pull-down operation by responding to the second driving signal RDV_N, and the second signal SIG2 having a high slope and changing to logic low may be output. In addition, when the reset signal RST is applied, both of the pull-up and pull-down operations may be activated.

Referring to FIG. 11, the first signal SIG1 that is input into the second buffer may have the low slope both in the rise section and the fall section. Meanwhile, the first reference voltage REF_L is sensed by the second buffer according to the current exemplary embodiment and, according to the sensing result, the second signal SIG2 in which the slope in the rise section is improved may be generated and output through the line. Also, the second reference voltage REF_H is sensed by the second buffer, and according to the sensing result, the second signal SIG2 in which the slope in the fall section is improved may be generated and output through the line.

According to the exemplary embodiment described above, the first signal SIG1 and the second signal SIG2 are illustrated and described as different signals from each other. However, practically, the first signal SIG1 and the second signal SIG2 are signals of an identical node. Accordingly, it may be described that the second buffer outputs the second signal SIG2, or that the second buffer receives the first signal SIG1 and outputs the first signal SIG1 by improving the slope through the line.

Also, according to the exemplary embodiment described above, the first reference voltage REF_L or the second reference voltage REF_H are signals having a stable voltage level. However, exemplary embodiments are not limited thereto. For example, the first reference voltage REF_L and/or the second reference voltage REF_H may be signals that make a certain value of a current flow through the transistors M and N that are connected in series, and thus, the first reference voltage REF_L and/or the second reference voltage REF_H may have a changed voltage level according to resistive elements of a pathway through which the reference voltages are provided.

Figure 12A:
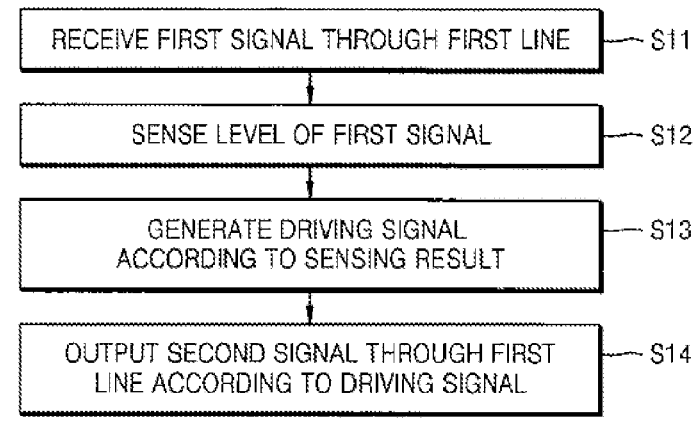
FIGS. 12A and 12B are block diagrams illustrating an operation method of a semiconductor device according to an exemplary embodiment.
Figure 12B:
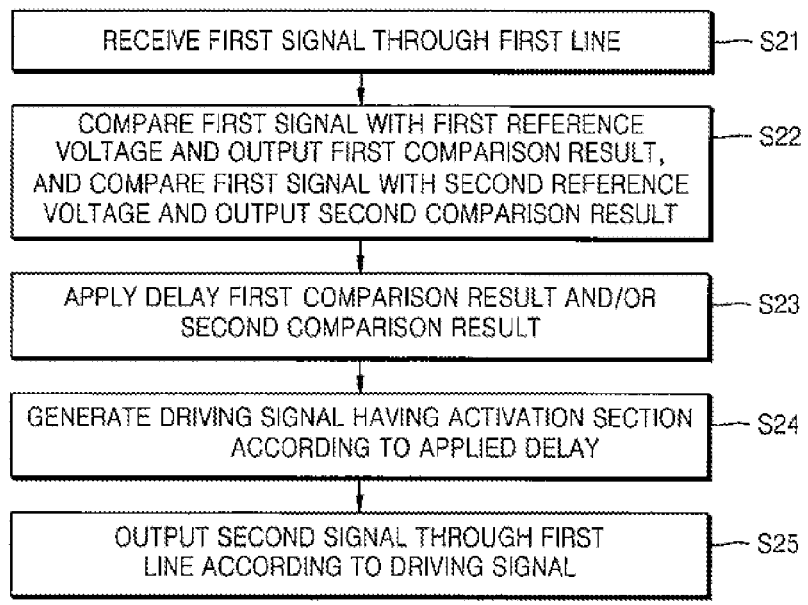

FIGS. 12A and 12B are block diagrams illustrating an operation method of a semiconductor device according to an exemplary embodiment.

As shown in FIG. 12A, a first buffer and a second buffer are arranged in two portions of a first line and, a first signal from the first buffer is provided through the first line. The second buffer receives the first signal transmitted through the first line in operation S11.

The second buffer senses a level of the received first signal in operation S12. For example, the second buffer senses a point in which the first signal reaches a first level (for example, the first reference voltage REF_L described above) in a rise section of the first signal. According to the sensing result, a driving signal is generated in operation S13. For example, when the first signal reaches the same as or higher than the first level, the driving signal for performing a pull-up operation may be activated during a certain section and generated. According to the activated driving signal, the pull-up operation of the second buffer is performed, and a pulled-up second signal may be output through the first line in operation S14.

Meanwhile, in the above described operation, the first level may be the second reference voltage REF_H of the exemplary embodiment described above. That is, the first level that may be the second reference voltage REF_H may be sensed in a fall section of the first signal and, according to the sensing result, the driving signal for performing a pull-down operation may be activated in a certain section and generated. According to the activated driving signal, the pull-down operation of the second buffer is performed, and the second signal that is pulled-down may be output through the first line.

FIG. 12B is a block diagram illustrating an operation method of a semiconductor device according to another exemplary embodiment. FIG. 12B illustrates an example in which a delay operation is applied to the second buffer in order to control an activation section of the driving signal.

As shown in FIG. 12B, a first signal that is output from a first buffer is provided to a second buffer through a first line. The second buffer receives the first signal through the first line in operation S21, and outputs a first comparison result signal that is the result of comparing levels of the first signal and a first reference voltage in operation S22. Also, in operation S22, the second buffer outputs a second comparison result signal that is the result of comparing levels of the first signal and a second reference voltage.

A driving signal is generated based on the first comparison result signal and the second comparison result signal. Also, a delay may be applied to the first and/or second comparison result signals in operation S23 in order to control the activation section of the driving signal. The driving signal having the activation section according to the result of applying the delay is generated in operation S24. For example, as in the above described exemplary embodiment, the driving signal for pulling up a second signal by responding to the first comparison result signal may be activated. Also, the driving signal for pulling-up the second signal by responding to a signal that is a delayed signal of the second comparison result signal may be deactivated. Meanwhile, the driving signal for pulling-down the second signal according to the second comparison result signal may be activated. Also, the second signal that is pulled-up or pulled-down by responding to the driving signal generated according to the above described exemplary embodiment is output though the first line in operation S25.

Figure 13A:
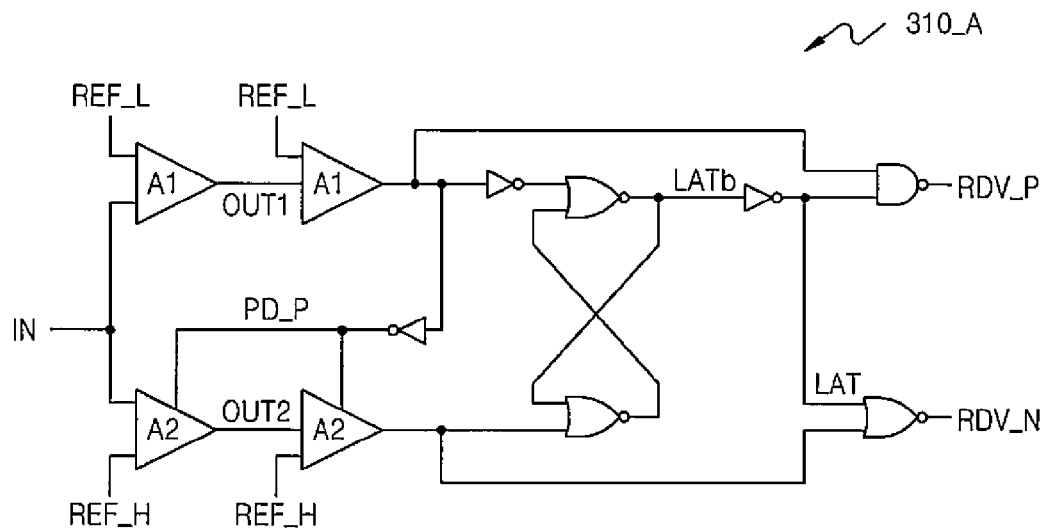
FIGS. 13A, 13B, and 13C are circuit diagrams of a second buffer according to another exemplary embodiment.
Figure 13B:
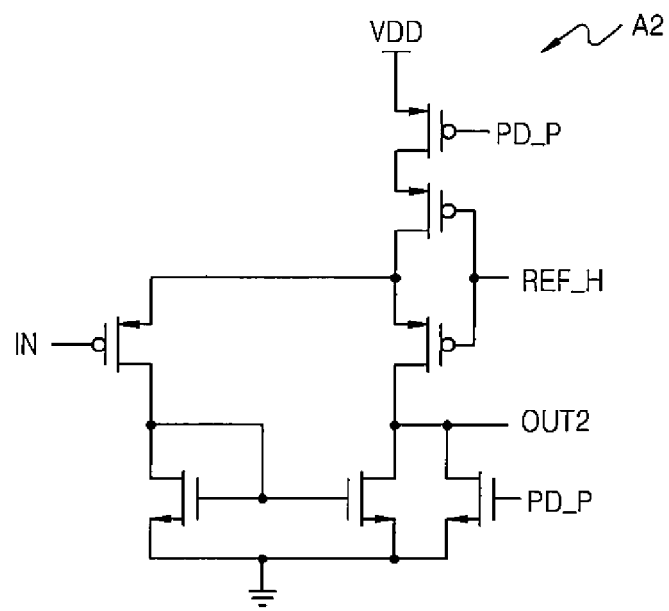
Figure 13C:
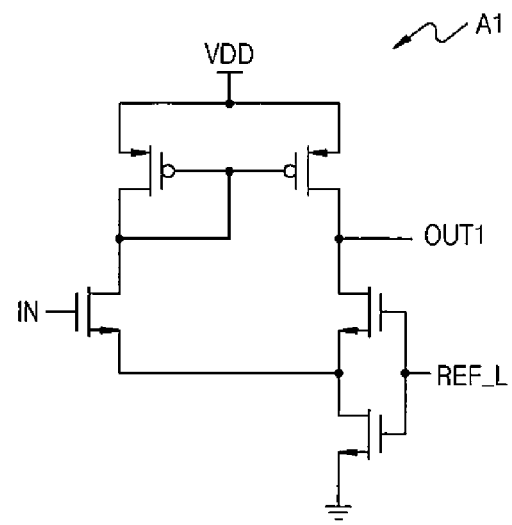
Figure 13D:
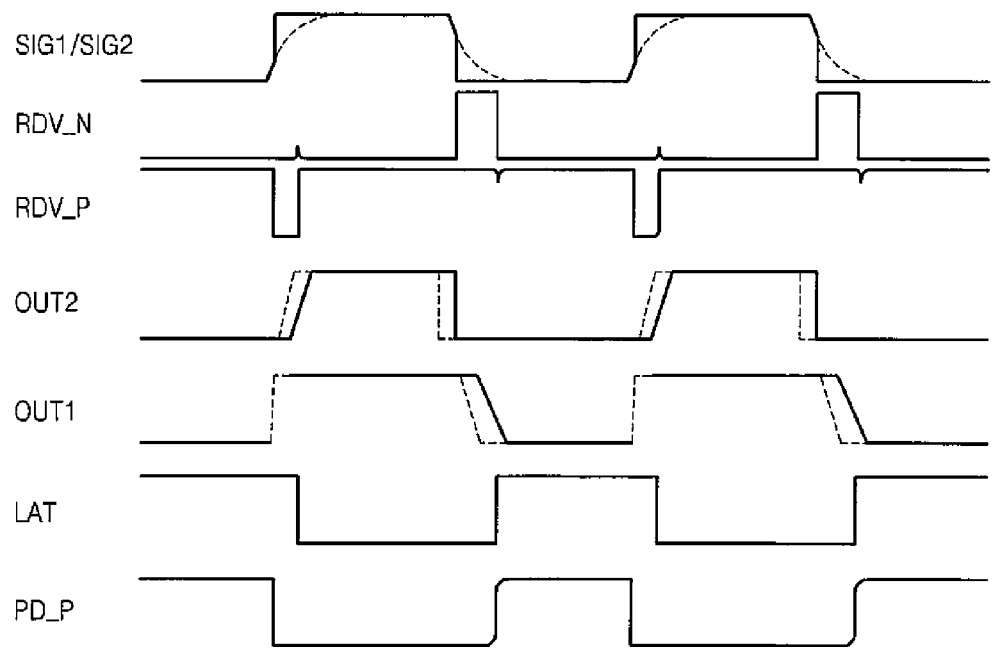
FIG. 13D is an example of a spectrogram illustrating an operation characteristic of the second buffer of FIGS. 13A-13C.

FIGS. 13A, 13B, and 13C are circuit diagrams of a second buffer according to another exemplary embodiment and FIG. 13D is an example of a spectrogram illustrating an operation method of the second buffer of FIGS. 13A-13C. Among circuits illustrated in FIGS. 13A, 13B, and 13C, the circuits that are identical or similar to the ones illustrated in FIGS. 7 through FIG. 9 also have identical or similar operation methods therewith, and thus, their descriptions will be omitted.

As shown in FIG. 13A, a driving circuit 310_A may include logic circuits and at least one comparator. For example, the driving circuit 310_A may include at least one first comparator A1 and at least one second comparator A2. As shown in FIG. 13C, the first comparator A1 may be implemented identically with the comparator illustrated in FIG. 8. Also, as shown in FIG. 13B, the second comparator A2 may be implemented partially identically with the comparator illustrated in FIG. 7, except that with the second comparator A2 in FIG. 13B, when a first signal is not received in an input IN, a power down signal PD_P generated inside the driving circuit 310_A may further be provided to the second comparator A2, in order to deactivate an output of the second comparator A2, and the second comparator A2 of FIG. 13B may further include at least one transistor that receives the power down signal PD_P.

The first comparator A1 illustrated in FIG. 13C may operate in a similar manner with the comparator illustrated in FIG. 8. For example, the first comparator A1 outputs a first comparison result signal OUT1 according to a comparison of levels of the first signal from the input IN and a first reference voltage REF_L. When the first signal increases to be the equal to or greater than the first reference voltage REF_L, the first comparison result signal OUT1 of a logic high level may be output. Also, when the first signal decreases to be less than the first reference voltage REF_L, the first comparison result signal OUT1 of a logic low level may be output. Also, when the first comparison result signal OUT1 changes from the logic high level to the logic low level, an output to which a delay is applied may be generated. Also, in a similar manner with the above described exemplary embodiment, the second comparator A2 outputs a second comparison result signal OUT2 according to a comparison of the levels of the first signal from the input IN and a second reference voltage REF_H. For example, when the second comparison result signal OUT2 changes from the logic low level to the logic high level, an output to which a delay is applied may be generated.

Referring to FIGS. 13A through 13D, first, when the first signal SIG1 is input by changing from the logic low level to the logic high level, when the first signal SIG1 increases to be equal to or greater than the first reference voltage REF_L, the first comparator A1 outputs the first comparison result signal OUT1 of logic high, and the first comparison result signal OUT1 is provided to a buffer circuit as a first driving signal RDV_P, passing through an additional first comparator A1, an inverter, a NOR gate, and a NAND gate. When the first driving signal RDV_P is activated, a second signal SIG2 of logic high is output from the buffer circuit.

Then, when the first signal SIG1 gradually increases, the first signal SIG1 may have a level that is equal to or greater than the second reference voltage REF_H and, the second comparator A2 may output the second comparison result signal OUT2 of logic high according to a comparison of the first signal SIG1 and the second reference voltage REF_H. The second comparison result signal OUT2 may also be logic operated with the first comparison result signal OUT1 by passing through an additional second comparator A2 and a NAND gate. When the result of the logic operation passes through additional logics, a control signal LAT may be generated and, according to the control signal LAT, the first driving signal RDV_P may be deactivated. Accordingly, the first driving signal RDV_P that is activated during a certain section may be generated.

Meanwhile, when the first signal SIG1 is input by changing from the logic high level to the logic low level, the second comparator A2 may output the second comparison result signal OUT2 of logic low according to a comparison of the first signal SIG1 and the second reference voltage REF_H. According to the second comparison result signal OUT2, a second driving signal RDV_N may be generated and, the buffer circuit performs a pull-down operation by responding to the second driving signal RDV_N. Then, the first signal SIG1 may gradually decrease to be equal to or less than the first reference voltage REF_L and, accordingly, the first comparator A1 outputs the first comparison result signal OUT1 of the logic low level. By a logic operation of the first comparison result signal OUT1 and the second comparison result signal OUT2, the control signal LAT may be generated and, according to the control signal LAT, the second driving signal RDV_N may be deactivated. Accordingly, the second driving signal RDV_N that is activated during a certain section may be generated and, the second signal SIG2 that is pulled-down during the activation section may be generated.

Meanwhile, the power down signal PD_P described above may be generated from a node in the driving circuit 310_A. For example, the power down signal PD_P may be generated by reversing an output of two of the first comparators A1 that are connected in series. The power down signal PD_P may be provided to the second comparator A2 and, when the signal is not received through the input IN, a current flow through the second comparator A2 may be reduced. Moreover, the activation section of the first driving signal RDV_P and the second driving signal RDV_N may be changed to have various forms. For example, the activation section of the first driving signal RDV_P and the second driving signal RDV_N may be changed by controlling the delay section by changing the number of logic circuits included in the driving circuit 310_A, by adding delay elements, or by controlling the delay section by changing the number of the first comparators A1 or the second comparators A2 in the driving circuit 310_A.

Figure 14:
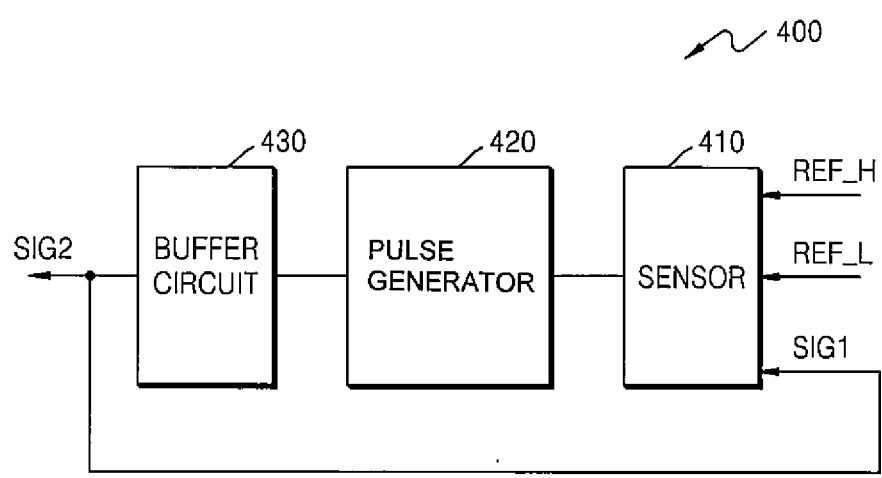
FIG. 14 is a block diagram of a buffer according to another exemplary embodiment.

FIG. 14 is a block diagram of a buffer according to another exemplary embodiment. In the above described exemplary embodiment, the example in which the activation section of the driving signal is controlled based on the comparison result signal to which a delay is applied. However, exemplary embodiments are not limited thereto, and various design alterations are possible. For example, as shown in FIG. 14, a second buffer 400 may include a sensor 410, a pulse generator 420, and a buffer circuit 430. The pulse generator 420 may output a pulse signal (for example, an auto pulse) that is activated during a certain section based on a sensing result from the sensor 410, through the buffer circuit 430.

The sensor 410 may receive a first signal SIG1, a first reference voltage REF_L, and a second reference voltage REF_H. The sensor 410 may generate a first sensing result by sensing a point in which the first signal SIG1 reaches the first reference voltage REF_L. Also, the sensor 410 may generate a second sensing result by sensing a point in which the first signal SIG1 reaches the second reference voltage REF_H. The pulse generator 420 may output a driving signal for pulling-up the second signal SIG2 by responding to the first sensing result, by activating the driving signal during a certain section. Also, the pulse generator 420 may output the driving signal for pulling-down the second signal SIG2 by responding to the second sensing result, by activating the driving signal during a certain section.

Additional information may be used to make the rise and fall sections of the first signal SIG1 have different logic levels, in order to pull-up the second signal SIG2 in a rise section of the first signal SIG1 and to pull-down the second signal SIG2 in a fall section of the first signal SIG1. For example, a signal including information as to whether the first signal SIG1 is in the rise section or in the fall section, may further be provided to the sensor 410. According to the exemplary embodiment illustrated in FIG. 14, a second signal SIG2 that has a wave form that is the same as or similar to that of the above described exemplary embodiment may be output.

Figure 15:
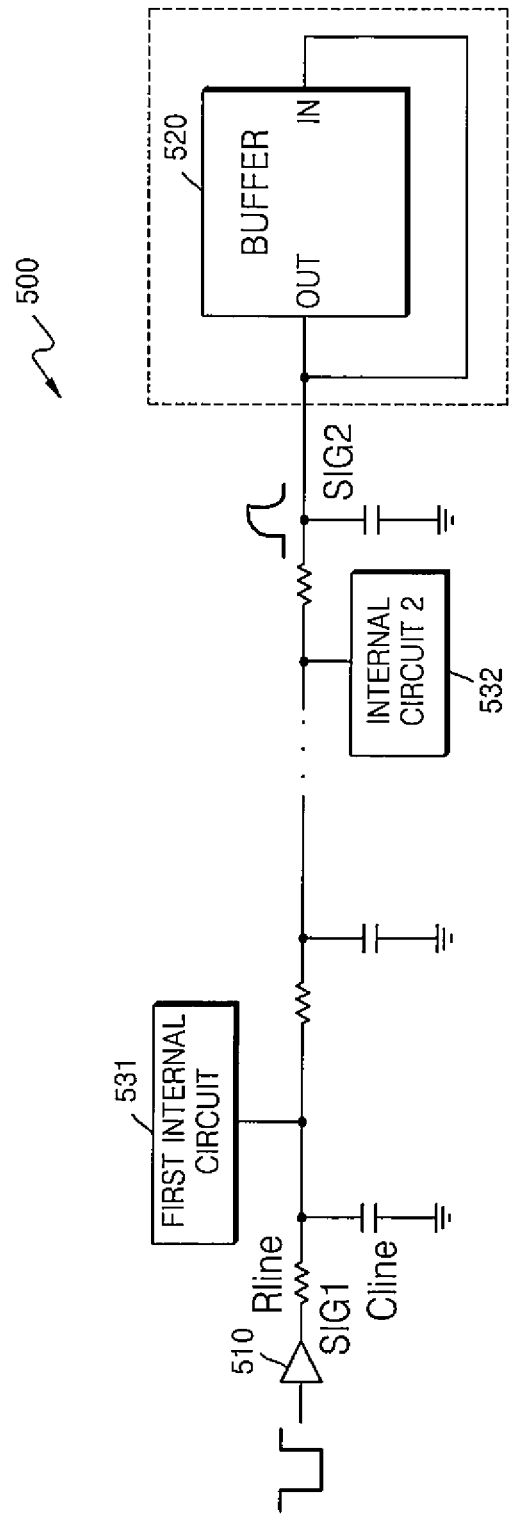
FIG. 15 is a circuit diagram of a line driving circuit according to an exemplary embodiment.

FIG. 15 is a circuit diagram illustrating a line driving circuit according to an exemplary embodiment. In the exemplary embodiment of FIG. 15, instead of the line included in the array, any of the lines through which various signals are transmitted in the semiconductor device 500 may be applied as the line through which the first signal and the second signal are output.

As shown in FIG. 15, the line driving circuit 500 may include a first buffer 510 and a second buffer 520. For the second buffer 520, a buffer included in the second driver (or the second buffer) described in the above described exemplary embodiment may be implemented. The line may include a parasitic resistive element Rline and a parasitic capacitance element Cline. Also, at least one internal circuit may be electrically connected to the line. As an example, FIG. 15 illustrates a first internal circuit 531 having a relatively short transmittance path from the first buffer 510, and a second internal circuit 532 having a relatively long transmittance path from the first buffer 510. That is, the first internal circuit 531 is physically positioned along the line closer to the first buffer 510 than the second buffer 520.

The first buffer 510 outputs a first signal SIG1 through the line and, the second buffer 520 receives the first signal SIG1 as an input. Also, the second buffer 520 generates and outputs a second signal SIG2, according to the pull-up and pull-down operations as in the above described exemplary embodiment. The second buffer 520 has an input IN and an output OUT that are electrically connected. Accordingly, the second buffer 520 changes a slope of the first signal SIG1 having a low slope value to have a higher slope value and, outputs the signal having the changed slope as the second signal SIG2. Accordingly, the signal having the improved slope characteristic may also be provided to the second internal circuit 532 having the relatively long transmittance path from the first buffer 510.

Figure 16A:
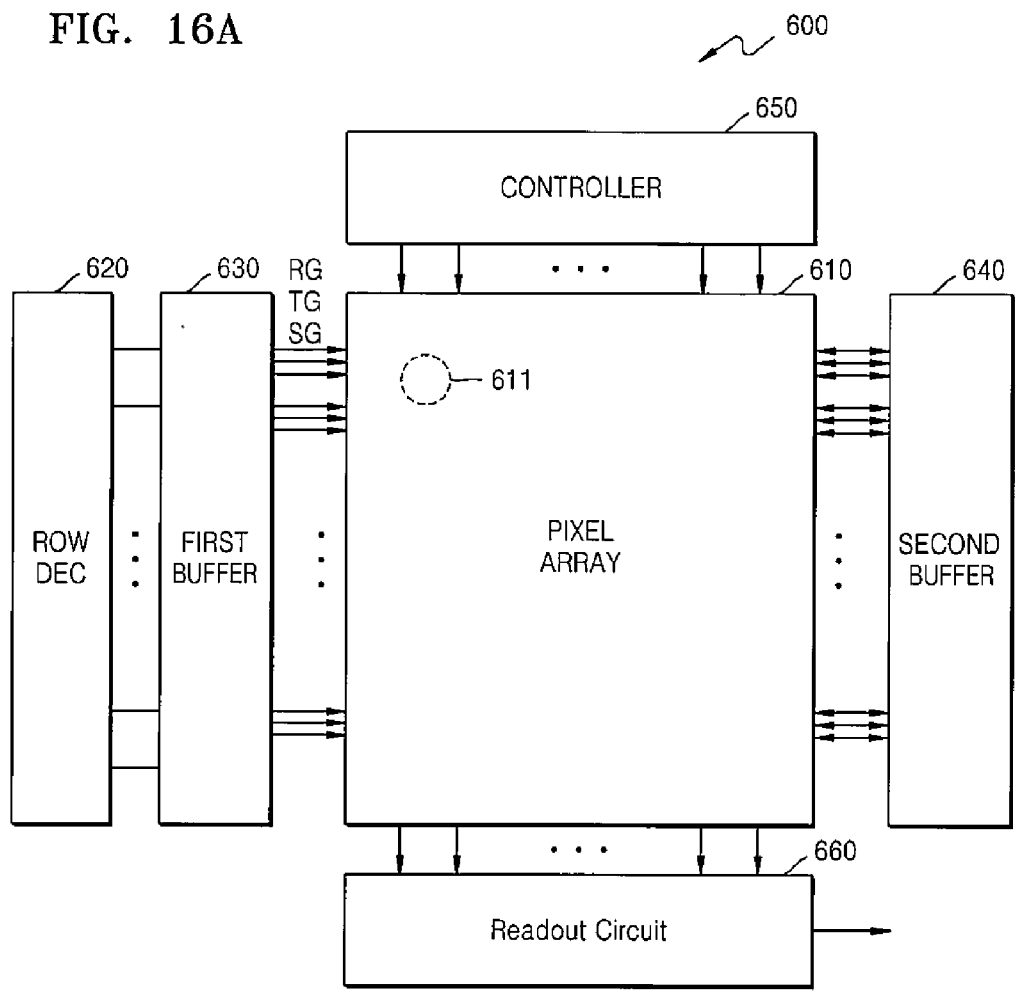
FIGS. 16A and 16B are block diagrams of a complementary metal oxide semiconductor (CMOS) image sensor according to an exemplary embodiment.
Figure 16B:
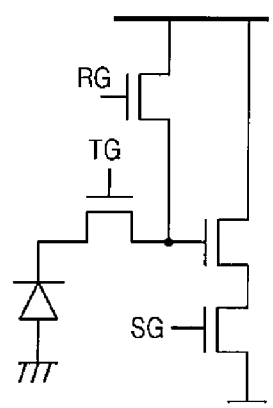

FIGS. 16A and 16B are block diagrams of a CMOS image sensor according to an exemplary embodiment.

The CMOS image sensor 600 according to the current exemplary embodiment may include a pixel array 610, a row decoder (Row Dec) 620, a first buffer 630, a second buffer 640, a controller 650, and a readout circuit 660. The pixel array 610 includes a plurality of CMOS pixels (hereinafter, referred to as pixels 611). The pixels 611 are a unit in which the CMOS image sensor 600 recognizes, stores, and processes an image, and, each of the pixels 611 includes a pixel circuit. Also, the pixel circuit may include a light sensing diode and at least one transistor. The light sensing diode may comprise a photo diode, a photo gate, and/or a photo transistor.

In addition, as shown in FIG. 16B, the each of the pixels 611 may include at least one transistor and, the least one transistor may comprise a reset transistor, a transmittance transistor, and/or a select transistor. The first buffer 630 provides signals for controlling the at least one transistor, and may output a reset signal RG, a transmittance signal TG, and/or a select signal SG. Also, the second buffer 640 receives the reset signal RG, the transmittance signal TG, and/or the select signal SG, and may perform a comparison operation and pull-up and pull-down operations for improving a characteristic of the signals (for example improving a slope characteristic).

The first buffer 630 in FIG. 16A may include the buffers described in the above described exemplary embodiments. For example, the first buffer 630 may include the first buffers in the above described exemplary embodiments. Also, the second buffer 640 may also include the buffers described in the above described exemplary embodiments. For example, the second buffer 640 may include the second buffers having a feedback structure in which the input and the output are electrically connected. Also, as in the above described exemplary embodiments, the first buffer 630 and the row decoder 620 are arranged in a portion of the pixel array 610 and, the second buffer 640 may be arranged in the other portion of the pixel array 610. The pixel array 610 includes a plurality of rows, and a plurality of word lines arranged according to each of the rows. The row decoder 620 performs a selected operation with respect to the word line by responding to an address from outside. A first buffer of the first buffer 630 is connected to a portion of the word line, and a second buffer of the second buffer 640 is connected to the other portion of the word line.

Also, as in the above described exemplary embodiments, the second buffer receives a first signal from the first buffer through the word line as an input signal. Also, the second buffer generates a second signal according to a result of sensing a level of the first signal and outputs the second signal through the word line. Accordingly, a characteristic of signals provided to pixels that are located relatively far from the first buffer 630 among pixels included in the pixel array 610, may be improved.

Also, the pixel array 610 may further include control lines for transmitting the reset signal RG and the select signal SG, in addition to the word line corresponding to the each of the rows. The first buffer 630 may further include first buffers corresponding to the control lines and, in a similar manner, the second buffer 640 may further include second buffers corresponding to the control lines. For the control lines, the above described exemplary embodiments according to which the characteristic of the signal transmitted through the word line may be improved may also be applied in a similar or identical manner.

The controller 650 outputs a control signal with respect to the pixel array 610 and controls an operation of the CMOS image sensor 600. Also, the readout circuit 660 may receive an input of electric signals that are pixels included in a selected row by the row decoder 620, which are converted. The electric signal that each of the pixels outputs is an analog signal and, the readout circuit 660 may convert the analog signal into a digital signal through an analog-to-digital converter (ADC). Also, the readout circuit 660 may sequentially output digital signals corresponding to a plurality of pixel circuits included in a row.

Figure 17:
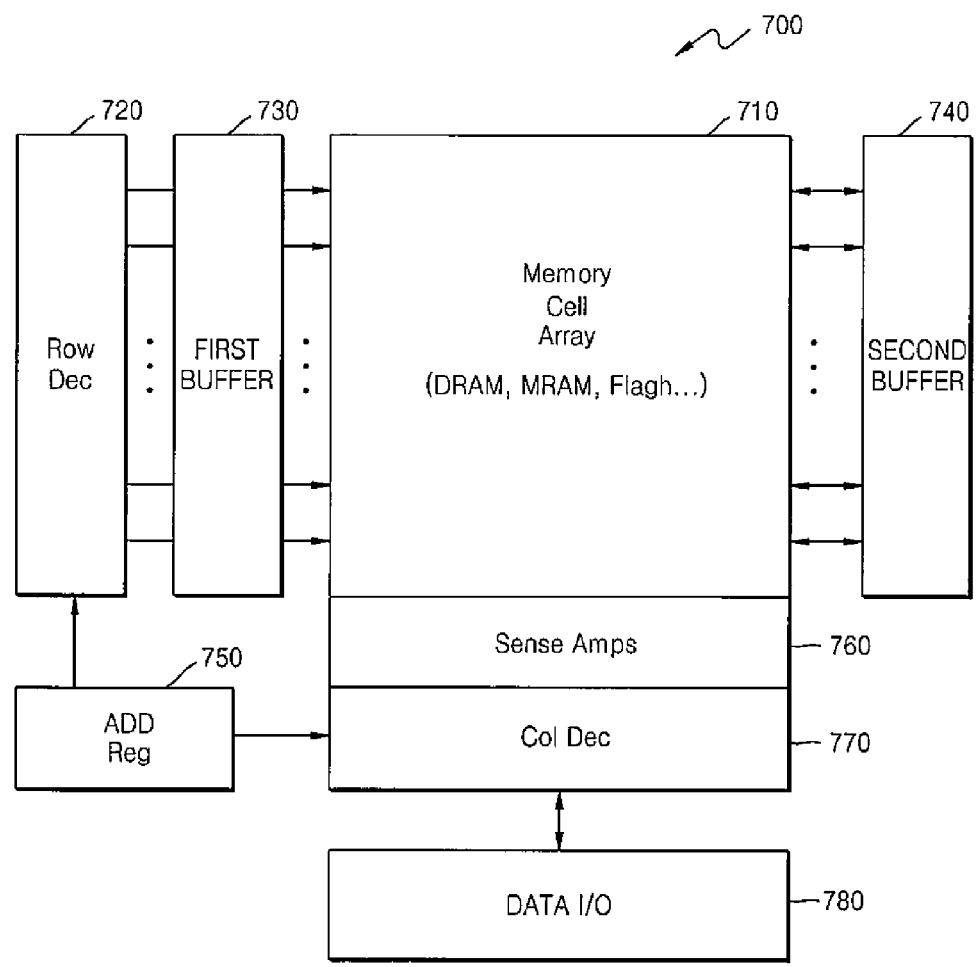
FIG. 17 is a block diagram of a semiconductor memory device according to an exemplary embodiment.

FIG. 17 is a block diagram of a semiconductor memory device according to an exemplary embodiment.

The current exemplary embodiment may be implemented in various semiconductor devices and, as shown in FIG. 17, the semiconductor memory device 700 may include a memory cell array 710. The memory cell array 710 may include various kinds of memory cells. For example, the memory cell array 710 may include a DRAM cell, an MRAM cell, and/or a flash memory cell.

The semiconductor memory device 700 according to the current exemplary embodiment may include a row decoder (Row Dec) 720, a first buffer 730, and a second buffer 740. Also, for a memory operation, the semiconductor memory device 700 may further include an address register (ADD Reg) 750, a sense amplifier (Sense Amps) 760, a column decoder (Col Dec) 770, and a data input and output (DATA I/O) 780.

The address register 750 receives an address from outside, provides a row address to the row decoder 720, and provides a column address to the column decoder 770. The memory cell array 710 includes a plurality of word lines and a plurality of bit lines. The row decoder 720 performs a selected operation with respect to the word lines. The column decoder 770 performs a selected operation with respect to the bit lines. The data of the selected memory cell is amplified by the sense amplifier 760 and is transmitted and received to and from outside by the data input and output 780.

According to the current exemplary embodiment, the first buffer 730 may include the buffers described in the above described exemplary embodiments. For example, the first buffer 730 may include the first buffers in the above described exemplary embodiments. Also, the second buffer 740 may include the buffers described in the above described embodiments. For example, the second buffer 740 may include the second buffers having the feedback structure in which the input and the output are electrically connected. Also, as in the above described exemplary embodiments, the second buffer receives a first signal from the first buffer through the word line as an input signal. Also the second buffer generates a second signal according to a result of sensing a level of the first signal and outputs the second signal through the word line. Accordingly, a characteristic of signals provided to memory cells that are located relatively far from the first buffer 630 among memory cells included in the memory cell array 710 may be improved.

Figure 18A:
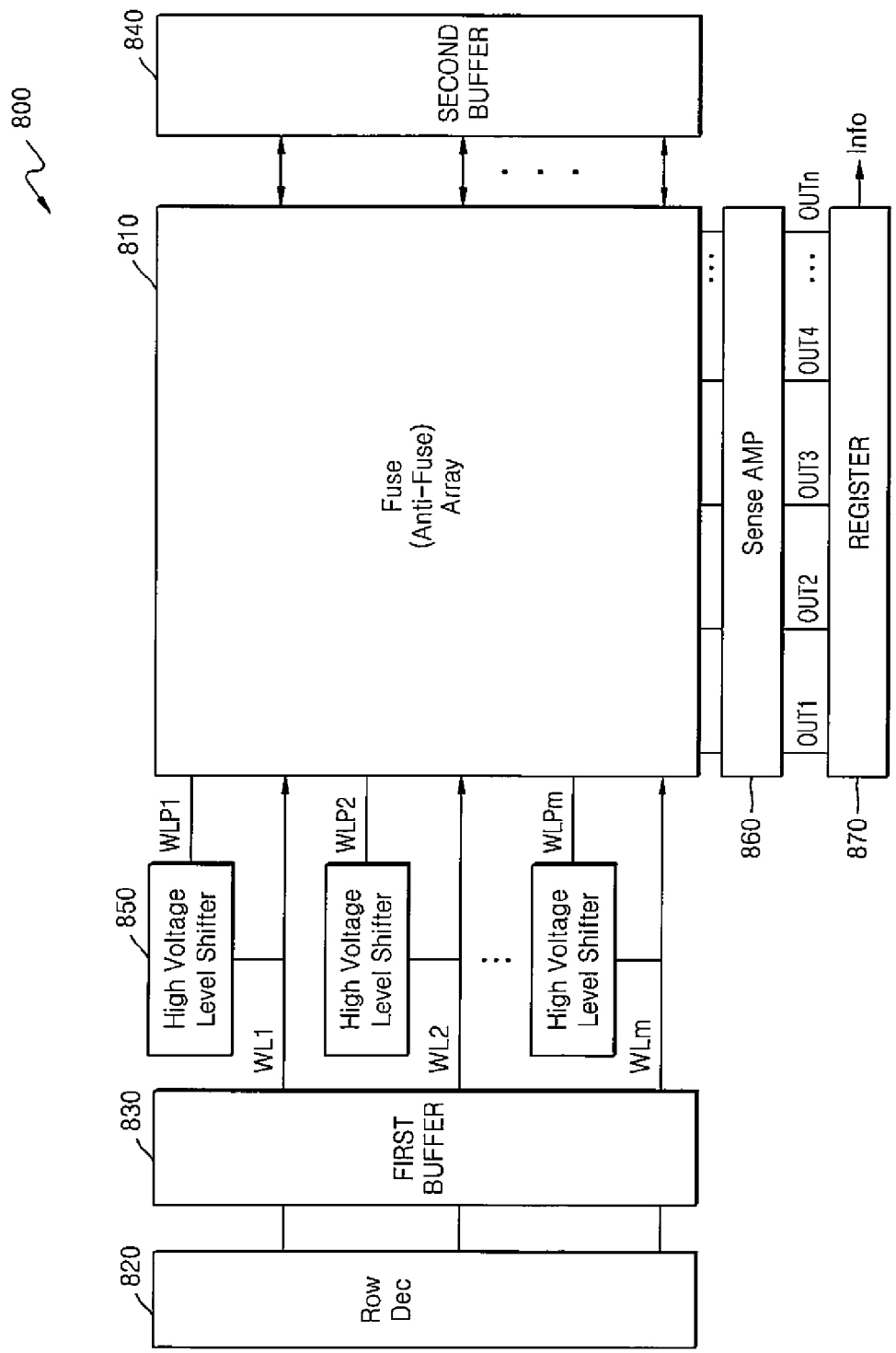
FIGS. 18A, 18B and 18C are block diagrams of a semiconductor device including a fuse array according to an exemplary embodiment.
Figure 18B:
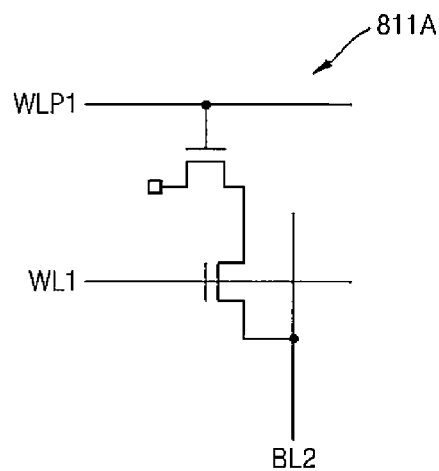

FIGS. 18A and 18B are block diagrams of a semiconductor device including a fuse array according to an exemplary embodiment. First and second buffers included in the current exemplary embodiment may be implemented in semiconductor devices including various kinds of lines. For example, the first and second buffers may be implemented in a semiconductor device including a fuse array for storing information.

As shown in FIG. 18A, the semiconductor device 800 according to the current exemplary embodiment may include a fuse array 810 including a plurality of fuses (or anti-fuses 811), a row decoder (Row Dec) 820, a first buffer 830, and a second buffer 840. Also, the semiconductor device 800 may further include a level shifter 850 for generating a high voltage for changing a resistive status of a fuse included in the fuse array 810, a sense amplifier (Sense AMP) 860 for amplifying information stored in the fuse array 810, and a Register 870 for temporarily storing the amplified information.

The fuse array 810 includes a plurality of fuses 811, and each of the fuses stores information. The fuse array 810 may comprise a laser fuse, the connection of which is controlled by laser radiation, and/or an electric fuse, the connection of which is controlled by an electrical signal. Alternatively, the fuse array 810 may include anti-fuses having a characteristic that the status may be changed from a high resistance to a low resistance by an electrical signal.

The fuse array 810 includes a plurality of word lines WL1 through WLm. The plurality of fuses 811 may be connected to each of the word lines WL1 through WLm. Also, the fuse array 810 may include a plurality of voltage transmittance lines WLP1 through WLPm for transmitting voltage signals for programming the fuses 811. As the voltage signal from the level shifter 850 is provided through the voltage transmittance lines WLP1 through WLPm, various information may be stored in the fuse array 810. For example, the various information may be information for configuring an operation environment of the semiconductor device 800.

Figure 18C:
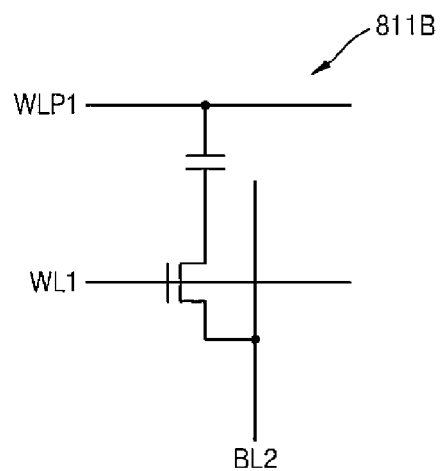

The first buffer 830 illustrated in FIG. 18A may also include the buffers described in the above described exemplary embodiments. For example, the first buffer 830 may include the first buffers in the above described exemplary embodiments. The second buffer 840 may also include the buffers described in the above described exemplary embodiments. For example, the second buffer 840 may include the second buffers having the feedback structure in which the input and the output are electrically connected. Also, as in the above described exemplary embodiments, the second buffer receives a first signal from the first buffer through the word line as an input signal. The second buffer generates a second signal according to a result of sensing a level of the first signal and outputs the second signal through the word line. Accordingly, a characteristic of signals provided to fuses that are located relatively far from the first buffer 830 may be improved. FIGS. 18B and 18C are a circuit diagrams illustrating examples of a unit structure of an anti-fuse of FIG. 18A. FIG. 18B illustrates an anti-fuse 811A including a fuse transistor and a select transistor. FIG. 18C illustrates an anti-fuse 811B including a fuse capacitor and a select transistor.

Figure 19:
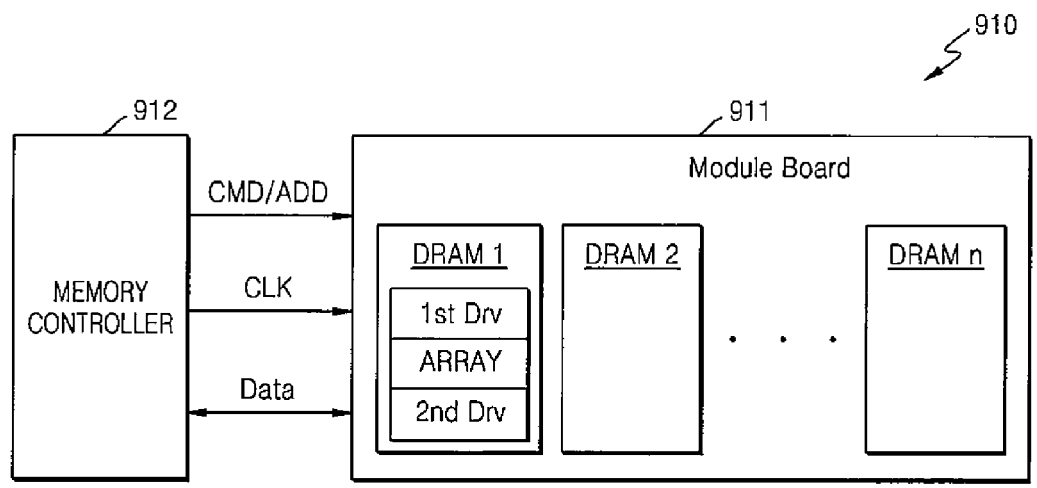
FIG. 19 is a block diagram of a memory module according to an exemplary embodiment.

FIG. 19 is a block diagram illustrating a memory module according to an exemplary embodiment. As shown in FIG. 19, the memory module 910 according to the current exemplary embodiment may communicate with a memory controller 912. Also, the memory module 910 includes a module board 911 and at least one semiconductor memory device mounted on the module board 911. For example, the semiconductor memory device may be a DRAM chip. Also, the semiconductor memory device may be a semiconductor memory device in which any one of the above described exemplary embodiments is implemented.

The memory module 910 transmits and receives various signals to and from the memory controller 912 for controlling a memory operation of the semiconductor memory device. For example, the memory module 910 may receive various commands (CMD), addresses (ADD), and/or clock signals (CLK) from the memory controller 912, and may transmit and receive data to and from the memory controller 912.

Also, the semiconductor memory device may include as an array a memory cell array including a plurality of cells. Also, a plurality of buffers for driving a plurality of lines (for example, word lines and bit lines) included in the array may be included in the semiconductor memory device. For example, as described in the above described exemplary embodiments, the first driver (1st Drv) including the plurality of first buffers and the second driver (2nd Drv) including the plurality of second buffers may be included in the semiconductor memory device.

Figure 20:
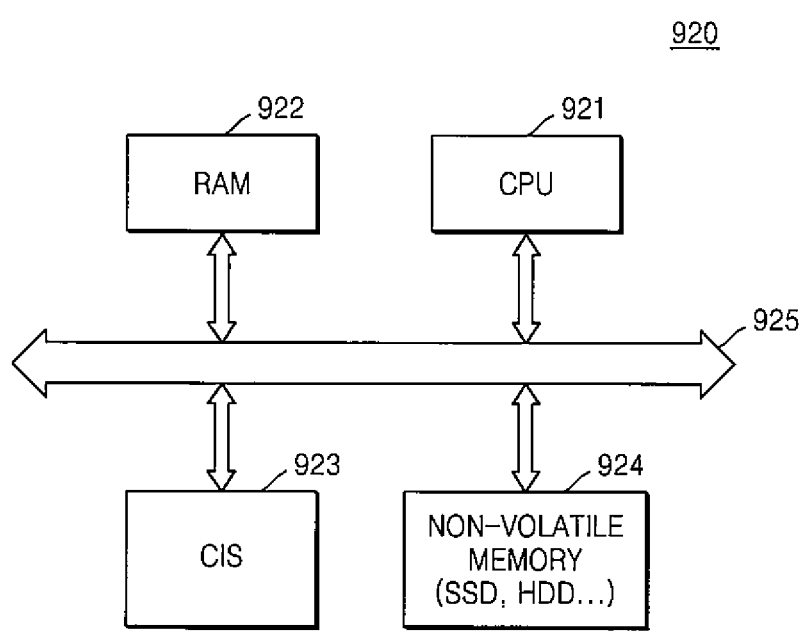
FIG. 20 is a block diagram of a computing system according to an exemplary embodiment.

FIG. 20 is a block diagram illustrating a computing system according to an exemplary embodiment.

As shown in FIG. 20, the semiconductor device according to the current exemplary embodiment may be mounted on a computing system 920 such as mobile devices or desk top computers, and may be implemented in a RAM 922 and/or a CMOS image sensor (CIS) 923. The semiconductor memory device mounted as the RAM 922 may include any of the above described exemplary embodiments. For example, the RAM 922 may include the semiconductor memory device of the above described exemplary embodiments, or may include a form of a memory module. Also, the RAM 922 or the CIS 923 respectively include a plurality of lines and, at least one line may be driven through the first buffer and the second buffer according to above described exemplary embodiments.

The computing system 920 according to the current exemplary embodiment may further include a central processing unit (CPU) 921 and a non-volatile memory 924. These components may electrically be connected to a bus 925 respectively. The non-volatile memory 924 may include a high capacitance storing device such as an SSD and/or an HDD.

While exemplary embodiments have been particularly shown and described, it will be understood that various changes in form and details may be made therein without departing from the spirit and scope of the following claims.

What is claimed is:

1. A semiconductor device comprising:
  a line controller arranged in a first portion of at least one line;
  a first driver arranged in the first portion and configured to output a first signal through the at least one line according to a control of the line controller; and
  a second driver arranged in a second portion of the at least one line and configured to output a second signal through the at least one line according to a level of the first signal,
  wherein the first driver comprises a first buffer connected to a first line of the at least one line, and the second driver comprises a second buffer connected to the first line, and
  wherein the second buffer is configured to receive the first signal through the first line and output the second signal through the first line according to a comparison of the first signal and at least one reference voltage.

2. The semiconductor device of claim 1, further comprising an array that comprises a word line as the at least one line, wherein the word line is electrically connected to at least one cell.

3. The semiconductor device of claim 1, wherein the second buffer comprises a driving circuit configured to output a driving signal in response to receiving the first signal, a first reference voltage, and a second reference voltage, and compare the first signal with the first reference voltage or the second reference voltage; and a buffer circuit configured to output the second signal through the first line in response to the driving signal.

4. The semiconductor device of claim 3, wherein the driving circuit is configured to output a first driving signal that is activated during a first section of the first signal in which the first signal is greater than or equal to the first reference voltage, and a second driving signal that is activated during a second section of the first signal in which the first signal is less than or equal to the second reference voltage.

5. The semiconductor device of claim 4, wherein the buffer circuit is configured to output through the first line the second signal that is at a logic high level when the first driving signal is activated, and the second signal that is at a logic low level when the second driving signal is activated.

6. The semiconductor device of claim 4, wherein the first section is a section that includes at least a portion of a rise section of the first signal, and the second section is a section that includes at least a portion of a fall section of the first signal.

7. The semiconductor device of claim 3, wherein the driving circuit comprises:
  a first comparator configured to output a first comparison signal by comparing the first signal and the first reference voltage;
  a second comparator configured to output a second comparison signal by comparing the first signal and the second reference voltage; and
  a driving signal generator configured to output the driving signal according to the first comparison signal or the second comparison signal,
  wherein at least one of the first comparison signal and the second comparison signal is delayed and the delayed at least one of the first comparison signal and the second comparison signal is output to the driving signal generator.

8. The semiconductor device of claim 1, wherein the second driver comprises at least one buffer that is connected to the at least one line and is configured to receive at least one reference voltage, and wherein each of the at least one buffer has a feedback structure in which an input of the buffer and an output of the buffer are connected to each other, and each of the at least one buffer is configured to output the second signal that is at a logic high level or a logic low level according to a comparison of levels of the first signal and the reference voltage.

9. A line driving circuit comprising:
a first buffer arranged in a first portion of a line electrically connected to at least one internal circuit and configured to output a first signal through the line; and
a second buffer arranged in a second portion of the line, and configured to receive the first signal and at least one reference voltage, and output a second signal through the line according to a comparison of levels of the first signal and the at least one reference voltage.

10. The line driving circuit of claim 9, wherein the second buffer is configured to output the second signal that is at a logic high level during a first section comprising at least a portion of a rise section of the first signal, and the second signal that is at a logic low level during a second section comprising at least a portion of a fall section of the first signal.

11. The line driving circuit of claim 10, wherein the second buffer is configured to receive a first reference voltage and a second reference voltage,
the first section is a section extending from a point in which the first signal is greater than or equal to the first reference voltage to a point that is delayed for a first predetermined period, and
the second section is a section extending from a point in which the first signal is less than or equal to the second reference voltage to a point that is delayed for a second predetermined period.

12. The line driving circuit of claim 9, wherein an input of the second buffer is electrically connected to an output of the second buffer.

13. The line driving circuit of claim 9, wherein the internal circuit comprises a memory cell.

14. The line driving circuit of claim 9, wherein the internal circuit comprises a complementary metal oxide semiconductor (CMOS) pixel.

15. A line driving circuit comprising:
a line controller electrically connected to a signal line;
a first driver electrically connected to the signal line and arranged at a first position of the signal line that is a first distance from the line controller, the first driver configured to output a first signal through the signal line in response to control from the line controller; and
a second driver electrically connected to the signal line and arranged at a second position of the signal line that is a second distance from the line controller, the second distance being greater than the first distance,
wherein the second driver is configured to receive the first signal in a deteriorated form at the second position, and output a second signal through the at least one line according to a level of the deteriorated form of the first signal,
wherein the first driver comprises a first buffer connected to the signal line, and the second driver comprises a second buffer connected to the signal line, and
wherein the second buffer is configured to receive the first signal through the signal line and output the second signal through the signal line according to a comparison of the first signal and at least one reference voltage.

16. The line driving circuit of claim 15, further comprising at least one element electrically connected to the signal line between the first position and the second position, the at least one element causing deterioration in the first signal to produce the deteriorated form.

17. The line driving circuit of claim 16, wherein the second driver is configured to generate the second signal by pulling up a rise portion of the first signal or by pulling down a fall portion of the first signal.

18. The line driving circuit of claim 16, wherein the second driver is configured to generate the second signal by pulling up a rise portion of the first signal or by pulling down a fall portion of the first signal.

19. The line driving circuit of claim 16, wherein the second driver comprises a buffer comprising an input and an output and electrically connected to the signal line, and
the input is electrically connected to the output.

* * * * *